(12) United States Patent
Chang

(10) Patent No.: US 10,475,506 B1
(45) Date of Patent: Nov. 12, 2019

(54) LOW POWER DELAY BUFFER BETWEEN EQUALIZER AND HIGH SENSITIVITY SLICER

(71) Applicant: Integrated Device Technology, Inc., San Jose, CA (US)

(72) Inventor: David Chang, Santa Clara, CA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 16/117,230

(22) Filed: Aug. 30, 2018

(51) Int. Cl.
  *G11C 11/40* (2006.01)
  *G11C 11/4093* (2006.01)
  *G11C 11/4076* (2006.01)

(52) U.S. Cl.
  CPC ...... *G11C 11/4093* (2013.01); *G11C 11/4076* (2013.01)

(58) Field of Classification Search
  CPC .................. G11C 11/4093; G11C 11/4076
  See application file for complete search history.

(56) References Cited

U.S. PATENT DOCUMENTS 9,973,356 B1\* 5/2018 Livne ................ H04L 25/03057
2016/0294537 A1\* 10/2016 Hoshyar ............... H04L 7/0331

\* cited by examiner

*Primary Examiner* — Kabir A Timory
(74) *Attorney, Agent, or Firm* — Christopher P. Maiorana, PC

(57) ABSTRACT

An apparatus includes a continuous-time linear equalizer circuit, a buffer and at least one slicer. The continuous-time linear equalizer circuit may be configured to generate a first intermediate signal by equalizing an input signal relative to a reference voltage. The input signal may be single-ended. The first intermediate signal may be differential. The buffer may be configured to generate a second intermediate signal by delaying the first intermediate signal. The second intermediate signal may be differential. The slicer may be configured to generate an output signal by slicing the second intermediate signal. The output signal may be single-ended.

18 Claims, 12 Drawing Sheets

LOW POWER DELAY BUFFER BETWEEN EQUALIZER AND HIGH SENSITIVITY SLICER

FIELD OF THE INVENTION

The invention relates to memory generally and, more particularly, to a method and/or apparatus for implementing a low power delay buffer between an equalizer and a high sensitivity slicer.

BACKGROUND

Power consumption is important in conventional double data rate data buffer circuit designs and registered clock driver circuit designs. Power reduction is a challenge for receiver circuits as synchronization signal frequencies go above 2.2 gigahertz (GHz) to 3.2 GHz and higher. The synchronization signals commonly lag behind corresponding data signals due to clock trees in the receiver circuits.

Conventional circuitry that delays the data signals to account for the synchronization signal lag often consumes significant power. Common fold buffer and differential-to-single-end latch designs are power consuming designs. Furthermore, an equalizer frequency performance is often affected by decision feedback equalizer circuitry.

It would be desirable to implement a low power delay buffer between an equalizer and a high sensitivity slicer

SUMMARY

The invention concerns an apparatus including a continuous-time linear equalizer circuit, a buffer and at least one slicer. The continuous-time linear equalizer circuit may be configured to generate a first intermediate signal by equalizing an input signal relative to a reference voltage. The input signal may be single-ended. The first intermediate signal may be differential. The buffer may be configured to generate a second intermediate signal by delaying the first intermediate signal. The second intermediate signal may be differential. The slicer may be configured to generate an output signal by slicing the second intermediate signal. The output signal may be single-ended.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
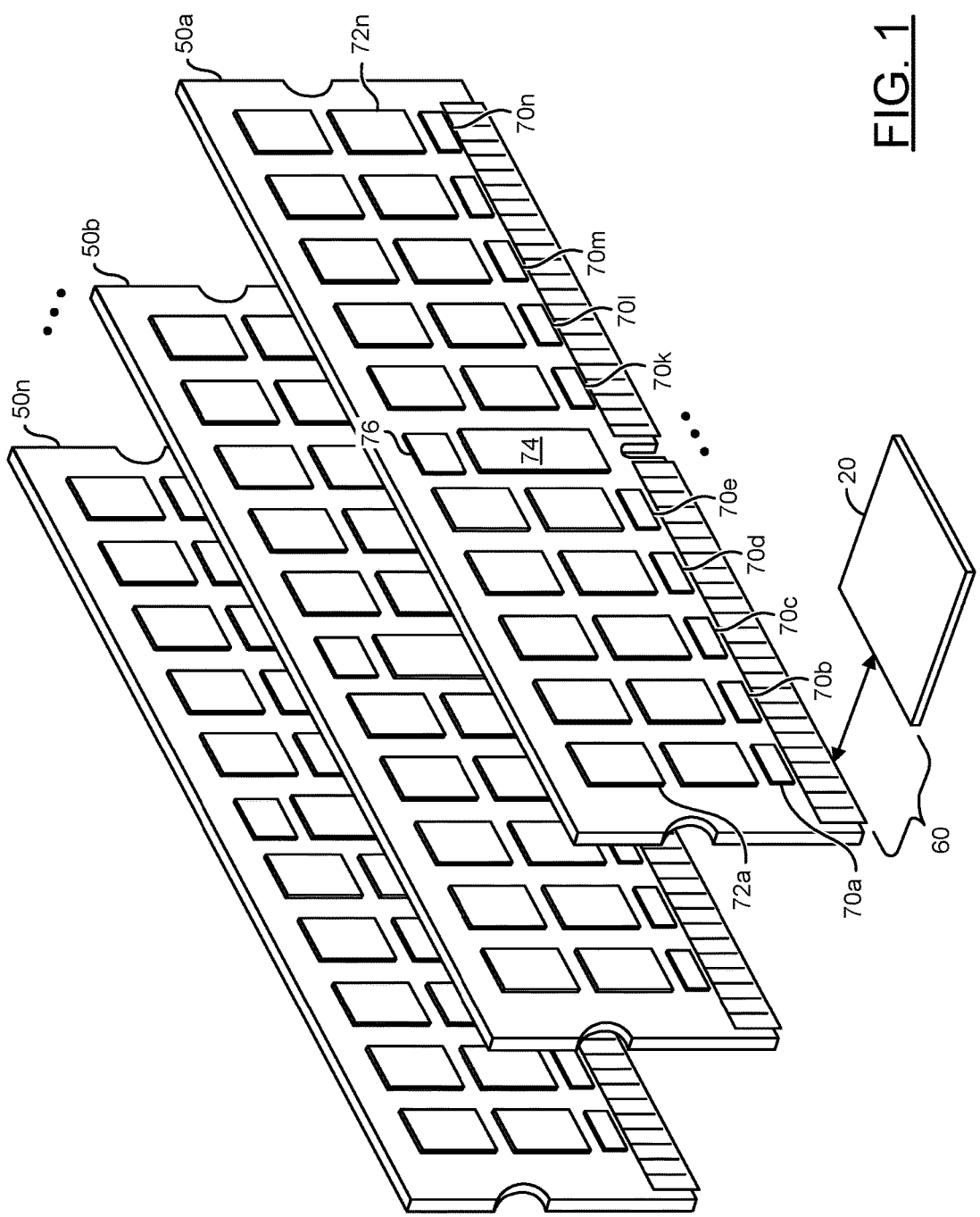
FIG. 1 is a diagram illustrating an example embodiment of a memory system in accordance with an example embodiment of the invention.

Embodiments of the present invention include providing a low power delay buffer between an equalizer and a high sensitivity slicer that may (i) consume low power, (ii) provide high vertical sensitivity with the equalizer and the slicer, (iii) provide a wide signal bandwidth, (iv) provide a programmable delay to improve a timing match between a data signal and a clock signal, (v) be implemented in a memory controller, (vi) be implemented in a registered clock driver, (vii) be implemented in a data buffer, and/or (viii) be implemented as one or more integrated circuits. Embodiments of the invention generally provide receiver circuitry comprising a continuous-time linear equalizer (CTLE) circuit, a delay circuit and one or more slicer circuits. The CTLE circuit may have a folded or current mode logic (CML) amplifier with source degeneration that contributes a zero pole and peak gain. The CML CTLE circuit may have a bandpass filter frequency response. A slicer circuit generally follows the CML CTLE circuit. Each slicer circuit may be a differential-to-single-end amplifier with a latch follower or a strongARM type of latch. In general, the CML amplifier and the strongARM latch may provide a low power advantage and a signal sensitivity of less than 4 millivolts (mv). In various embodiments, the signal sensitivity may be as large as 20 mV.

A vertical voltage gain and a horizontal timing may be two parameters in the receiver circuitry. Resolutions of the voltage gain and the horizontal timing are generally specified in a design specification. For example, a double data rate fifth generation (DDR5) specification may provide for a 0.15 unit interval (UI) delay. At a unit interval length of approximately 208.3 picosecond (ps) (e.g., about 2.2 giga-transfers per second), the 0.15 UI may be approximately 32.2 ps long. To meet the criteria, the delay buffer may be added in the receiver path to adjust the timing, achieve a low power, provide a unity gain, and provide a high bandwidth amplification with a programmable delay.

In various embodiments, a source follower type of delay buffer may be implemented between the CML CTLE circuit and the slicer circuits. The source follower delay buffer generally provides a significant low power advantage and a high signal bandwidth compared with common designs. The source follower delay buffer may also isolate the CML CTLE circuit and a decision feedback equalizer (DFE) circuit that may normally affect the CML CTLE circuit frequency response with different current digital-to-analog converters on and off. The CML CTLE circuit, the source follower delay buffer, and the strongARM latch (as the slicer) generally provide a unique combination in the receiver architecture. The design may achieve a low power consumption, a high bandwidth and a high signal resolution (e.g., <4 mV) at high speeds of the DDR5 specification. A sensitivity of the strongARM latch may be better than common slicers. Furthermore, the delay buffer generally allows a data patch to be slowed (e.g., approximately up to 0.15 UIs) to match delays of a clocking tree used to distribute synchronization signals.

Referring to FIG. 1, a diagram of a memory system is shown in accordance with an example embodiment of the invention. In various embodiments, the memory system includes a number of circuits $50a$-$50n$. The circuits $50a$-$50n$ may be implemented as memory modules (or boards). In an example, the circuits $50a$-$50n$ may be implemented as dual in-line memory modules (DIMMs). In some embodiments, the circuits $50a$-$50n$ may be implemented as double data rate fourth generation (DDR4) synchronous dynamic random-access memory (SDRAM) modules. In some embodiments, the circuits $50a$-$50n$ may be implemented as double data rate fifth generation (DDR5) SDRAM modules.

In various embodiments, the circuits $50a$-$50n$ may comprise a number of blocks (or circuits) $70a$-$70n$, a number of blocks (or circuits) $72a$-$72n$, a block (or circuit) $74$, a block (or circuit) $76$ and/or various other blocks, circuits, pins, connectors and/or traces. The circuits $70a$-$70n$ may be configured as data buffers. The circuits $72a$-$72n$ may implement memory devices. In an example, the circuits $72a$-$72n$ may be implemented as synchronous dynamic random-access memory (SDRAM) devices (or chips, or modules). The circuit $74$ may be implemented as a registered clock driver (RCD). In an example, the RCD circuit $74$ may be implemented as a DDR4 RCD circuit. In another example, the RCD circuit $74$ may be implemented as a RCD circuit compliant with the JEDEC specification (e.g., DDR5 standard). For example, in embodiments implementing the circuits $50a$-$50n$ as DDR5 compliant SDRAM modules, the memory modules $50a$-$50n$ may comprise the circuits $72a$-$72n$ arranged in rows of ten SDRAM devices (or chips, or modules), the circuits $70a$-$70n$ arranged in a row corresponding with the circuits $72a$-$72n$, the RCD circuit $74$ located so that the circuits $72a$-$72n$ are in groups of five on either of two sides of the RCD circuit $74$, and a power management integrated circuit (PMIC) compliant with the JEDEC DDR5 specification. The circuit $76$ may be implemented as a power management integrated circuit (PMIC). The type, arrangement and/or number of components of the memory modules $50a$-$50n$ may be varied to meet the design criteria of a particular implementation.

The memory modules $50a$-$50n$ are shown connected to a block (or circuit) $20$. The circuit $20$ may implement a memory controller and/or host controller. The circuit $20$ may be located in another device, such as a computing engine. Various connectors/pins/traces $60$ may be implemented to connect the memory modules $50a$-$50n$ to the memory controller $20$. In some embodiments, the connectors/pins/traces $60$ may be a 288-pin configuration. In an example, the memory controller $20$ may be a component of a computer motherboard (or main board or host device). In another example, the memory controller $20$ may be a component of a microprocessor. In yet another example, the memory controller $20$ may be a component of a central processing unit (CPU).

In an example, some of the connectors/pins/traces $60$ may be part of the memory modules $50a$-$50n$ and some of the connectors/pins/traces $60$ may be part of the motherboard and/or memory controller $20$. The memory modules $50a$-$50n$ may be connected to the computer motherboard (e.g., by pins, traces and/or connectors $60$) to transfer data between components of a computing device and the memory modules $50a$-$50n$. In some embodiments, the connectors/pins/traces $60$ may implement an 80-bit bus. In an example, the memory controller $20$ may be implemented on a northbridge of the motherboard and/or as a component of a microprocessor (e.g., an Intel CPU, an AMD CPU, an ARM CPU, etc.). The implementation of the memory controller $20$ may be varied according to the design criteria of a particular implementation.

In various embodiments, the circuits $50a$-$50n$ may be implemented as DDR4 (or DDR5) SDRAM memory modules. In an example, the circuits $50a$-$50n$ may have a memory module density of 128 gigabyte (GB), one terabyte (TB), or higher per module (e.g., compared to 16 GB per dual in-line memory module (DIMM) in DDR3). In embodiments implementing DDR4 compliant SDRAM memory modules, the circuits $50a$-$50n$ may operate at voltages of 1.14 to 1.26 volts (V) with a frequency between 800-1600 megahertz (MHz) (e.g., compared to 1.35-1.575V at frequencies between 400-1067 MHz in DDR3). In embodiments implementing DDR5 compliant SDRAM memory modules, the circuits $50a$-$50n$ may operate with a frequency of 1.2-3.2 giga-Hertz (GHz) and/or higher frequencies. In embodiments implementing DDR5 standard SDRAM memory modules, there may be 5 memory modules on each side of the RCD $74$.

In some embodiments, the circuits $50a$-$50n$ may be implemented as low voltage DDR4 memory modules and operate at 1.05V. For example, in embodiments implementing low voltage DDR4 SDRAM memory modules, the circuits $50a$-$50n$ may implement 35% power savings compared to DDR3 memory. In embodiments implementing DDR4 SDRAM memory modules, the circuits $50a$-$50n$ may transfer data at speeds of about 1.6 to 3.2 giga-transfers per second (GT/s) and higher (e.g., compared to 0.8 to 2.13 GT/s in DDR3). In embodiments implementing DDR5 standard SDRAM memory modules, the circuits $50a$-$50n$ may have a data rate range from 3.2 GT/s to 4.6 GT/s. The operating parameters of the memory modules $50a$-$50n$ may be varied according to the design criteria of a particular implementation.

In an example, the memory modules $50a$-$50n$ may be compliant with the DDR4 specification entitled "DDR4 SDRAM", specification JESD79-4B, June 2017, published by the Joint Electron Device Engineering Council (JEDEC) Solid State Technology Association, Arlington, Va. Appropriate sections of the DDR4 specification (e.g., the DDR4 JEDEC specification) are hereby incorporated by reference in their entirety. In another example, the memory modules $50a$-$50n$ may be implemented according to a fifth generation (DDR5) standard (e.g., for which a standard is currently under development by JEDEC). References to the DDR5 standard may refer to a latest working and/or draft version of the DDR5 specification published and/or distributed to committee members by JEDEC as of May 2018. Appropriate sections of the DDR5 standard are hereby incorporated by reference in their entirety. The JEDEC specification may refer to the DDR4 SDRAM specification, a DDR5 SDRAM specification and/or specifications for future generations of DDR SDRAM.

In some embodiments, the memory modules $50a$-$50n$ may be implemented as DDR4 load reduced DIMM (LRDIMM). The data buffers $70a$-$70n$ may allow the memory modules $50a$-$50n$ to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
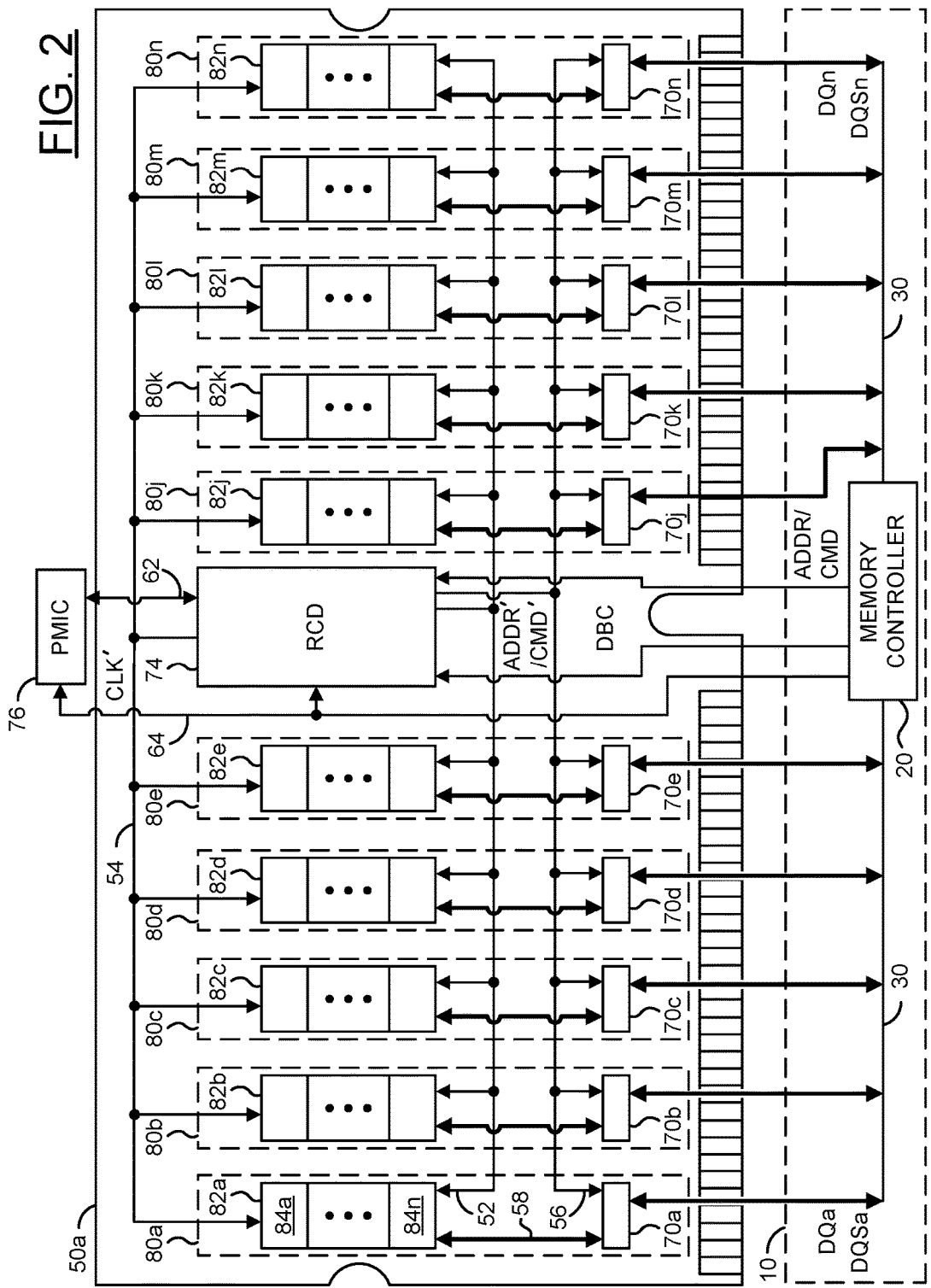
FIG. 2 is a block diagram illustrating a memory module in accordance with an example embodiment of the invention.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine or host device that communicates with the memory module 50a.

The memory module 50a may comprise one or more blocks (or circuits) 80a-80n, the RCD circuit 74 and/or the PMIC 76. The circuits 80a-80n may implement data paths of the memory module 50a. For example, the data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a clock signal (e.g., CLK), a number of control signals (e.g., ADDR/CMD) and/or a number of commands. The signal CLK and/or the signals ADDR/CMD may be presented to the RCD circuit 74. The commands may be presented to the PMIC 76 via a bus 64. A data bus 30 may be connected between the memory controller 20 and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n. For example, the signals DQa-DQn may be the DQ signals defined in the JEDEC specification and the signals DQSa-DQSn may be the DQS signals defined in the JEDEC specification. In the example shown, each of the signals DQa-DQn may have a corresponding signal DQSa-DQSn, however in some embodiments, one DQS signal may strobe multiple (e.g., four) DQ signals.

The RCD circuit 74 may be configured to communicate with the memory controller 20, the data buffers 70a-70n, the memory channels 82a-82n and/or the PMIC 76. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In an example, the RCD circuit 74 may implement a serial communication bus (e.g., a 1 MHz inter-integrated circuit ($I^2C$) bus, etc.). However, other types of management bus protocols (e.g., sideband interface, etc.) may be implemented to meet design criteria of particular implementations. In some embodiments, the RCD circuit 74 may implement a 12.5 MHz inter-integrated circuit ($I^3C$) bus. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may correspond with a signal Y_CLK in the DDR4 specification. The signal CLK' and/or the signals ADDR'/CMD' may be presented to each of the memory channels 82a-82n. In one example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for x4 DRAMS or 8-bit bytes for x8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

An interface 62 is shown. The interface 62 may be configured to enable communication between the RCD circuit 74 and the PMIC 76. For example, the interface 62 may implement a register clock driver/power management integrated circuit interface (e.g., a RCD-PMIC interface). The interface 62 may comprise one or more signals and/or connections. Some of the signals and/or connections implemented by the interface 62 may be unidirectional. Some of the signals and/or connections implemented by the interface 62 may be bidirectional. The interface 62 may be enabled by the host memory controller 20. In one example, the memory controller may enable the interface 62 for the RCD using the signal ADDR/CMD. In another example, the memory controller 20 may enable the interface 62 for the PMIC 76 by presenting an enable command.

The bus 64 may be implemented as a host interface bus. The host interface bus 64 may be bi-directional. The host interface bus 64 may be configured to communicate commands and/or other data to the PMIC 76 and/or other components of the memory module 50a. In some embodiments, the bus 64 may communicate with the RCD 74. In some embodiments, the host interface bus 64 may implement an $I^2C$ protocol. In some embodiments, the host interface bus 64 may implement an $I^3C$ protocol. The protocol implemented by the host interface 64 may be varied according to the design criteria of a particular implementation.

Figure 3:
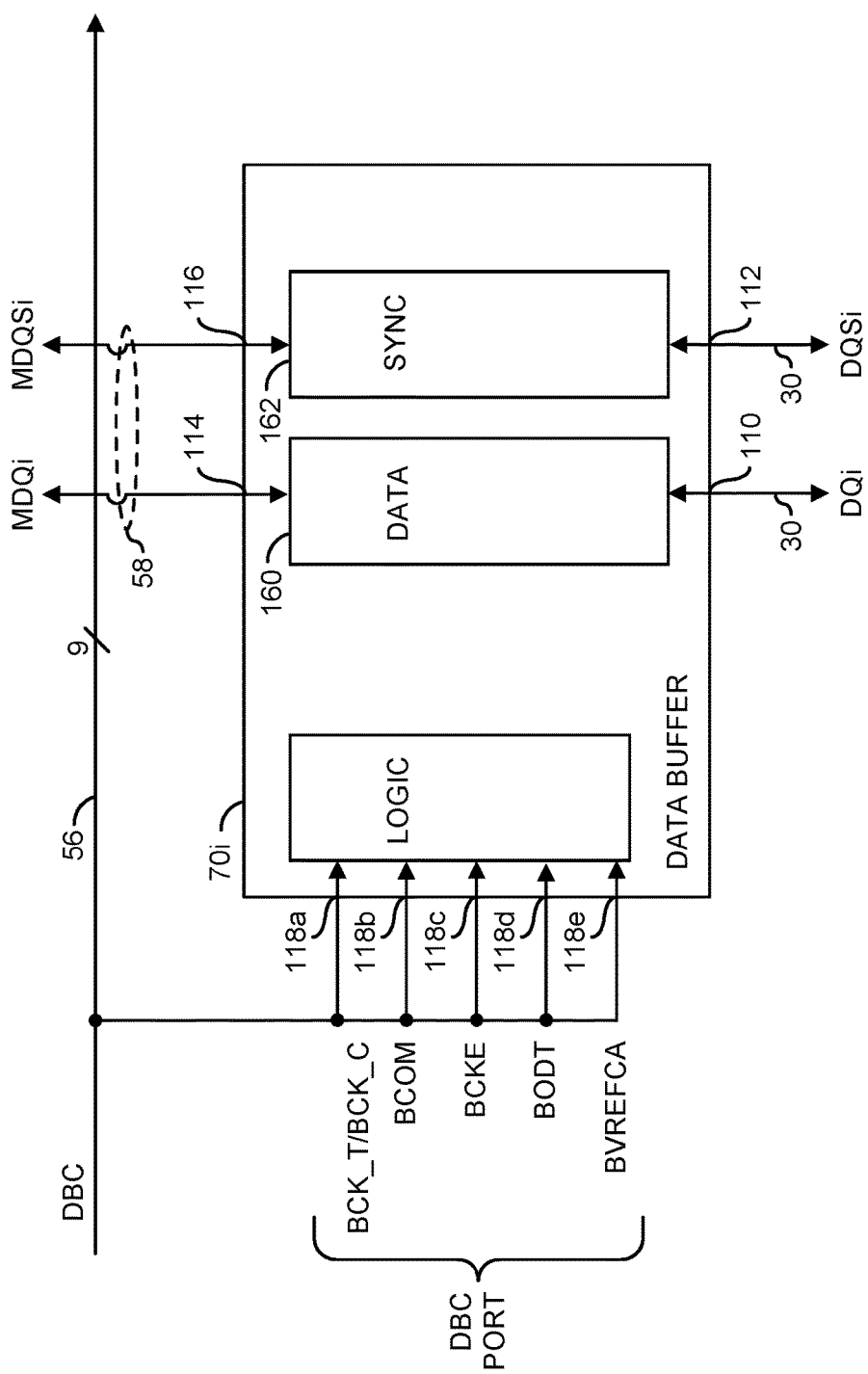
FIG. 3 is a block diagram illustrating a data buffer in accordance with an example embodiment of the invention.

Referring to FIG. 3, a diagram is shown illustrating a data buffer 70i in accordance with an example embodiment of the invention. The data buffer 70i may be representative of an example embodiment of the data buffers 70a-70n. The data buffer 70i is shown having a first input/output 110, a second input/output 112, a third input/output 114, and a fourth input/output 116.

The first input/output 110 is configured for presenting/receiving the signals DQi (e.g., the data signals DQ corresponding to a memory channel) between the data buffer 70i and the controller 20. The second input/output 112 is configured for presenting/receiving the signals DQSi (e.g., the data strobe signals DQS corresponding to the memory channel) between the data buffer 70i and the controller 20. The third input/output 114 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 116 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffers 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70i is shown having an input 118a receiving the signals BCK_T/BCK_C, an input 118b receiving the signal BCOM, an input 118c receiving the signal BCKE, an input 118d receiving the signal BODT, and an input 118e receiving the signal BVREFCA.

In various embodiments, the signals BCKT/BCKC may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70a-70n may receive a set of data buffer commands (e.g., for writing buffer control words (BCWs)) from the signals DBC. The buffer control words may be used to customize operation of the data buffers 70a-70n. The buffer control words may flow from the memory controller 20, through the RCD circuit 74, to the data buffers 70a-70n. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70a-70n. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70a-70n, the data buffers 70a-70n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM and/or the DDR5 standard, the RCD circuit 74 may send all read/write commands and MRS information over the bus 56 (e.g., to allow the data buffers 70a-70n to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70a-70n via the bus 56. The data buffers 70a-70n may write the buffer control word to a function space to complete the command.

The data buffers 70a-70n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70a-70n may be decided based on system level configurations. Generally, most of the configuration of the data buffers 70a-70n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70a-70n. The bus 56 may also send commands (e.g., data reads and/or data writes) that control data traffic through the data buffers 70a-70n. For example, some commands may optimize power consumption and noise filtering (e.g., equalization) of the data buffers 70a-70n. In another example, read/write delays may be added per data line.

The data buffers 70a-70n may implement dual multi-bit (e.g., 4-bit) bidirectional data registers with differential data strobes (e.g., DQS_T/DQS_C). The data buffers 70a-70n may implement automatic impedance calibration. The data buffers 70a-70n may implement BCOM parity checking. The data buffers 70a-70n may implement control register (e.g., buffer control word) readback.

In some embodiments, each data buffer 70a-70n may further comprise a block (or circuit) 160, a block (or circuit) 162 and a block (or circuit) 164. The block 160 may implement a data module through the buffer 70i. The data module 160 generally receives write data in the signal DQi through the input/output 110 and transfers the write data to the signal MDQi at the input/output 114. The data module 160 may also receive read data through the signal MDQi that is transferred to the signal DQi. The block 162 may implement a synchronization module. The synchronization module 162 may receive write synchronization information in the signal DSQi via the input/output 112. The module 162 may also receive read synchronization information in the signal MDQi via the input/output 116. The block 164 may implement a logic module. The logic module 164 is generally operational to provide communications with the data buffer 70i via the DBC port (e.g., the inputs 118a-118e). The module 164 may be configured to control operations of the data buffer 70i based upon commands received via the DBC port. The module 164 is generally enabled to configure the module 160 and the module 162 for operation.

Figure 4:
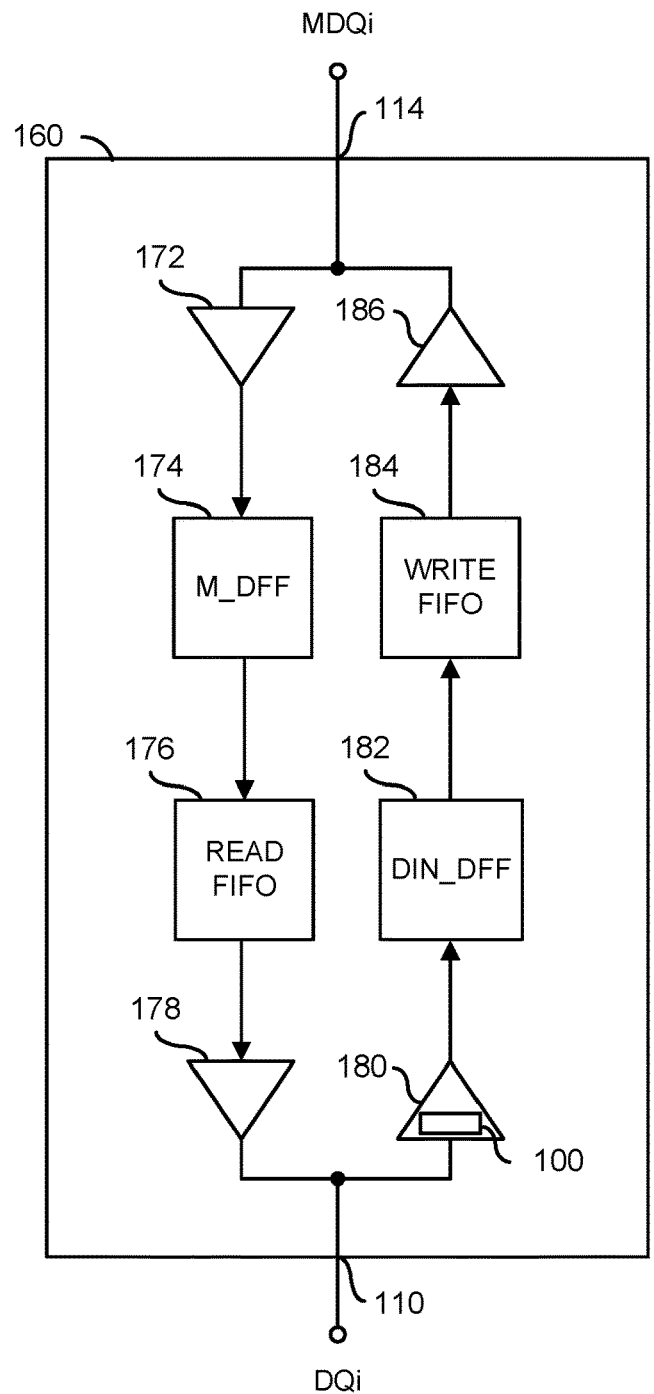
FIG. 4 is a diagram illustrating a data module in accordance with an example embodiment of the invention.

Referring to FIG. 4, a diagram is shown illustrating an example implementation of the data module 160 in accordance with an example embodiment of the invention. In an example, the data module 160 may comprise a block (or circuit) 172, a block (or circuit) 174, a block (or circuit) 176, a block (or circuit) 178, a block (or circuit) 180, a block (or circuit) 182, a block (or circuit) 184 and a block (or circuit) 186. The block 180 may comprise a block (or circuit) 100.

The block 172 and the block 180 may be implemented as receivers or buffers. The block 178 and the block 186 may be implemented as transmitters or buffer/drivers. The blocks 174 and 182 may be implemented as flip-flops. In some embodiments, the flip-flops 174 and 182 may be implemented as D-type flip-flops (DFF). The flip-flops 174 and 182 may be used to sample and hold the write/read data received from the receivers 172 and 180 based on the synchronization timing provided by the module 162 (see FIG. 3). The blocks 176 and 184 may be implemented as memories. The memories 176 and 184 may be configured as first-in first-out (FIFO) memories. In some embodiments, the memories 176 and 184 may be implemented as separate, independent memory blocks or devices. In some embodiments, the memories 176 and 184 may be implemented as portions of a single memory block or device.

In one example, the input/output 112 may be connected to an input of the block 172 and an output of the block 186. An output of the block 172 may be connected to an input of the block 174. An output of the blocks 174 may be connected to an input of the block 176. An output of the blocks 176 may be connected to an input of the block 178. An output of the block 178 may be connected to the input/output 110.

The input/output 110 may be connected to an input of the block 180 and the output of the block 178. An output of the block 180 may be connected to an input of the block 182. An output of the block 182 may be connected to an input of the block 184. An output of the block 184 may be connected to an input of the block 186. An output of the block 186 may be connected to the input/output 114.

Figure 5:
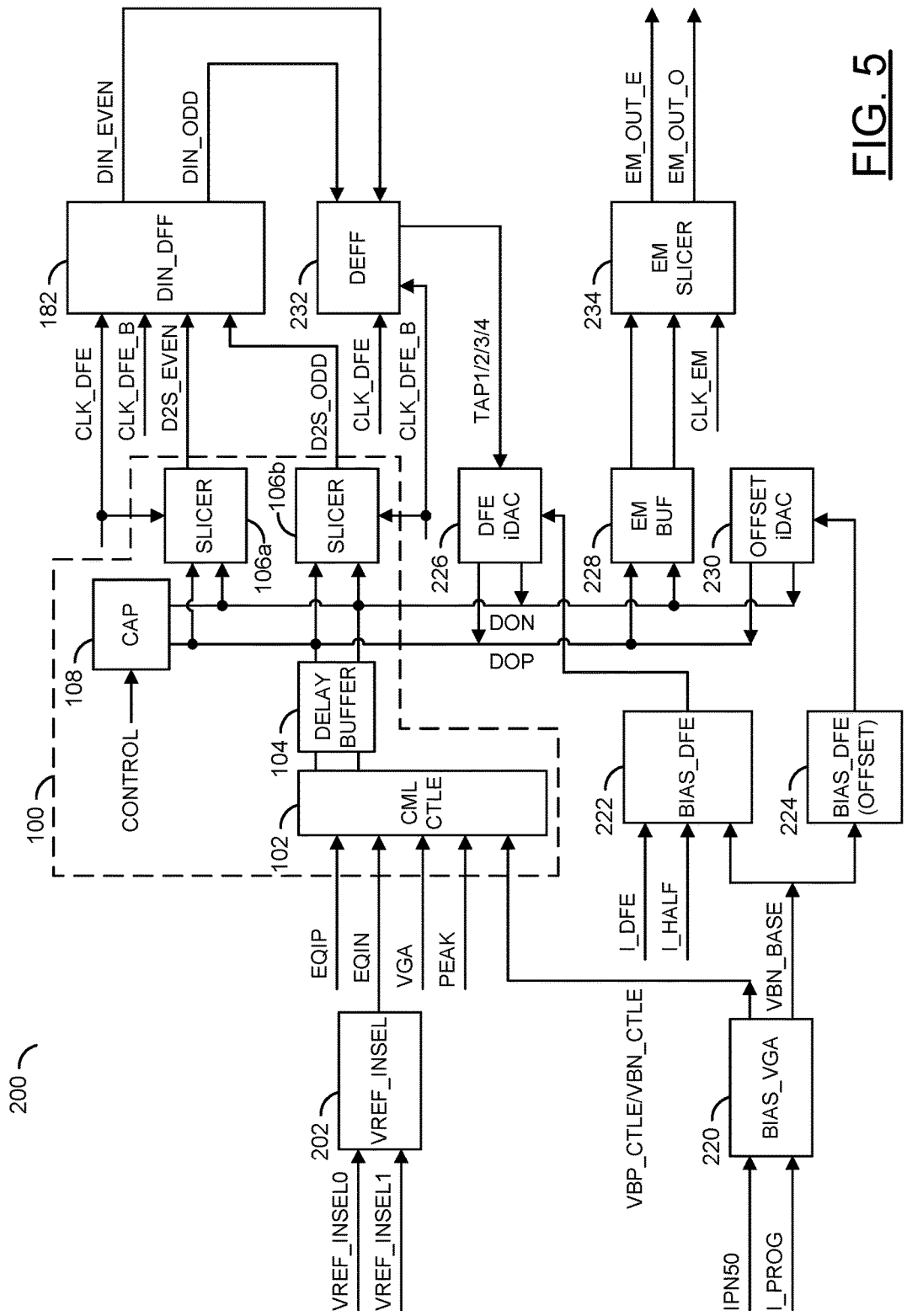
FIG. 5 is a diagram illustrating a data path for data signals in accordance with an example embodiment of the invention.

Referring to FIG. 5, a diagram illustrating an example data path 200 for data signals is shown in accordance with an example embodiment of the invention. In various embodiments, the data path 200 may be a receiver structure of the RCD 74. In other embodiments, the data path 200 may be part of the data buffers 70a-70n. For example the data path 200 may be part of the data module 160.

The data path 200 may comprise the apparatus 100, the flip-flop 182 and a block (or circuit) 202. The circuit 100 may implement a block (or circuit) 102, a block (or circuit) 104, one or more blocks (or circuits) 106a-106b and a block (or circuit) 108.

In various embodiments, the circuit 102 may implement a CTLE module. In some embodiments the circuit 102 may implement a CML CTLE module. The circuit 104 may implement a delay buffer module. Each circuit 106a-106b may implement a slicer module. The circuit 108 may implement a load capacitance module. The circuit 202 may implement a VREF_INSEL module (e.g., a reference voltage module).

Generally, the input data is transmitted through the data path 200 via the cascading arrangement of the CTLE module 102, the delay module 104, the slicer modules 106a-106b and the DFF module 182. The data may be sampled by one or more clocks in the DFF module 182.

The data path 200 may further comprise a block (or circuit) 220, a block (or circuit) 222, a block (or circuit) 224, a block (or circuit) 226, a block (or circuit) 228, a block (or circuit) 230, a block (or circuit) 232 and/or a block (or circuit) 234.

The circuit 220 may implement a BIAS_VGA module. The circuit 222 may implement a BIAS_DFE module. The circuit 224 may implement a BIAS_DFE offset module. The circuit 226 may implement a DFE iDAC module. The circuit 228 may implement an eye monitor (EM) buffer module. The circuit 230 may implement an offset iDAC module. The circuit 232 may implement a DEFF module. The circuit 234 may implement an EM slicer module. The circuits 220-234 may perform various functions (e.g., calculate decision feedback equalizer values) for the receiver data path 200. The data path 200 may comprise other components (not shown). The type, number, arrangement and/or functionality of the components of the data path 200 may be varied according to the design criteria of a particular implementation.

The reference voltage module 202 may receive an input signal (e.g., VREF_INSEL0) and/or an input signal (e.g., VREF_INSEL1). The reference voltage module 202 may generate the signal EQIN. The load capacitance module 108 may receive a control signal (e.g., CONTROL). The apparatus 100 may receive an input signal (e.g., EQIP), a reference signal (e.g., EQIN), an input signal (e.g., VGA), an input signal (e.g., PEAK) and a pair of input signals (e.g., VBP_CTLE/VBN_CTLE). The signal VGA, the signal PEAK and/or the signals VBP_CTLE/VBN_CTLE may be received by the CTLE module 102. The number, type and/or arrangement of the input signals to the apparatus 100 may be varied according to the design criteria of a particular implementation.

The CTLE module 102 may receive the signal EQIP, the signal EQIN, the signal VGA, the signal PEAK and/or the signals VBP_CTLE/VBN_CTLE. The signal VGA and/or the signal PEAK may be digital control signals used by the CTLE module 102. For example, the CTLE module 102 may be configured to select a gain value in response to the signal VGA and signal EQIP. The signals VBP_CTLE/VBN_CTLE may be generated by the BIAS_VGA module 220. For example, the BIAS_VGA module 220 may output one or more bias voltages. The overall gain of the data path 200 may be generated in response to the signals VGA (e.g., to program the gain of the CTLE module 102) and the signal PEAK. In an example, the signal PEAK may be used to provide different AC peaking to compensate for channel loss. Generally, the peaking is preferred to be similar under different gain settings.

The signal VREF_INSEL0 and/or the signal VREF_INSEL1 may be received by the reference voltage module 202. The reference voltage module 202 may be configured to generate the signal EQIN. The signal EQIN may be presented as an input to the CTLE module 102.

The reference voltage module 202 may comprise a voltage multiplexer configured to select a suitable reference voltage. For example, the voltage multiplexer of the reference voltage module 202 may select the reference voltage from the signal VREF_INSEL0 and/or the signal VREF_INSEL1. In one example, the signal EQIN may be one of the signal VREF_INSEL0 or the signal VREF_INSEL1.

The capacitance load module 108 may adjust a loading on the delay buffer module 104 in response to the signal CONTROL. The adjustments may cause a change in delay in a pair of output signals (e.g., DOP and DON) generated by the delay buffer module 104 and received by the slicer modules 106a-106b. The signal DOP and the signal DON may form a differential signal. The delay in the signals DOP/DON caused by the capacitance load module 108 based on the signal CONTROL may range from approximately 3 ps to approximately 50 ps.

The slicer modules 106a-106b may present signals (e.g., D2S_EVEN and D2S_ODD) in response to the signal DOP and the signal DON. The signals D2S_EVEN and D2S_ODD may be presented to the DFF module 182. Each signal D2S_EVEN and D2S_ODD may be a single-ended signal generated by the slicer modules 106a-106b in response to the input differential signals DOP and DON generated by the delay buffer module 104. The slicer modules 106a-106b may compare a voltage of the differential signals DOP and DON generated by the delay buffer module 104. For example, the signals D2S_EVEN and D2S_ODD may be a logical high value when the voltage of the signal DOP is larger than the voltage of the signal DON. In another example, the signals D2S_EVEN and D2S_ODD may be a logical low value when the voltage of the signal DOP is less than the voltage of the signal DON.

The DFF module 182 may receive clock inputs (e.g., a signal CLK_DFE and a signal CLK_DFE_B). In an example, the signal CLK_DFE and the signal CLK_DFE_B may each be a component of the signal CLK received by the RCD 74. The DFF module 182 may comprise a group of delay flip-flops with different clocks (e.g., CLK_DFE/CLK_DFE_B). For example, the clock input CLK_DFE may be used to sample the data signal D2S_EVEN. The clock input CLK_DFE_B may be used to sample the data signal D2S_ODD. The DFF module 182 may present an output of the data path 200. The DFF module 182 may generate a signal (e.g., DIN_EVEN) and/or a signal (e.g., DIN_ODD). For example, the signal DIN_EVEN may be data sampled on the clock signal CLK_DFE and the signal DIN_ODD_HSB may be data sampled on the clock signal CLK_DFE_B. In various embodiments, each signal DIN_EVEN and/or the signal DIN_ODD may be implemented as multiple signals, one signal to carry the least significant bits and another signal to carry the highest significant bits.

The CTLE module 102 and/or the reference voltage module 202 may work together to realize the wide programmable DC gain of the receiver 180. The CTLE module 102 may comprise one input branch in order to implement a 0 decibels (dB) to +6 dB gain range with a 2 dB least significant bit (LSB). The input branch implemented by the CTLE module 102 may relieve capacitive loading at the output of the CTLE module 102.

Figure 6:
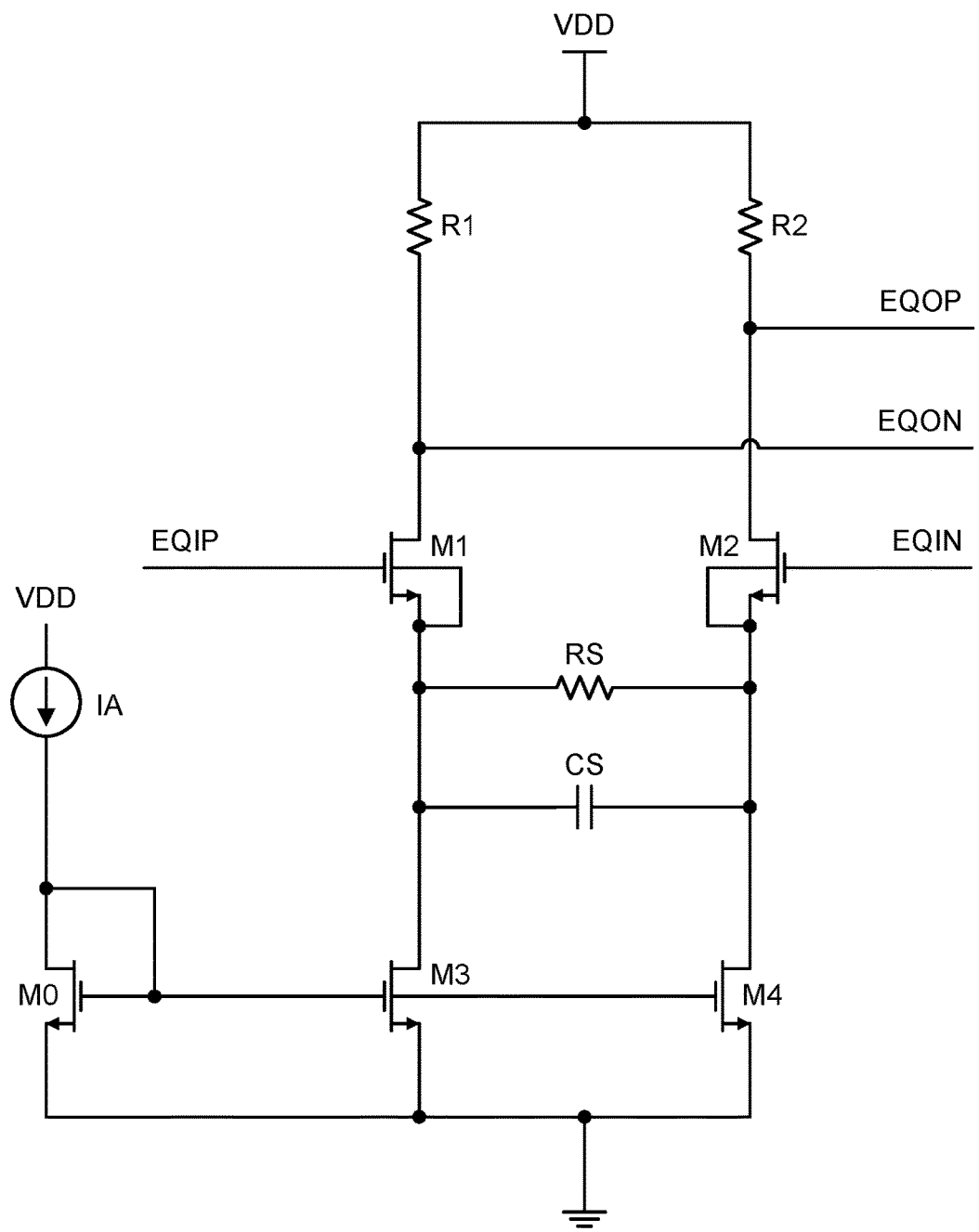
FIG. 6 is a schematic diagram illustrating a continuous-time linear equalizer module in accordance with an example embodiment of the invention.

Referring to FIG. 6, a schematic diagram illustrating an example implementation of the CTLE module 102 is shown in accordance with an example embodiment of the invention. The CTLE module 102 generally comprises multiple transistors M0 to M4, multiple resistors R1, R2 and RS, a capacitor CS, and a current source IA.

The signal EQIP may be received at a gate node of the transistors M1. The signal EQIN may be received at a gate node of the transistor M2. The load resistors R1 and R2 may receive the power supply voltage VDD. The current source IA may receive the power supply voltage VDD.

The transistors M1 and M2 are generally arranged as an amplifier having parallel paths (or sides). Load resistors R1 and R2 may be connected to the power supply voltage VDD to the transistors M1 and M2, respectively. The capacitor CS and the resistor RS may be connected in parallel between source nodes of the transistors M1 and M2 to set a filter frequency characteristic of the CTLE module 102. In various embodiments, the filter characteristic may cause the CTLE module 102 to function as a negative impedance converter.

The transistors M3 and M4 may be connected in series with the transistors M1 and M2 in the respective sides of the amplifier. The transistors M3 and M4 may be operational as current sources. Biasing of the gate nodes of the transistors M3 and M4 may be controlled by the current source IA and the transistor M0. The current generated by the current source IA may not be sensitive to power source fluctuations and so uses the power supply voltage VDD. In operation, the differential signal EQOP/EQON may be responsive to the signal EQIP relative to the reference voltage signal EQIN.

In an example, the conditioning performed by the CTLE module 102 may boost high frequency components of the differential signal EQOP/EQON relative to lower frequency components. A particular amount of crosstalk (e.g., noise) between the signal EQOP and the signal EQON may present a practical limit the amount of boosting that may be applied. The CTLE module 102 may increase an amount of the amplitude of the differential signal EQOP/EQON. The amplitude may be increased without an increase in an amount of crosstalk and/or reflections (e.g., noise).

When the signal EQIP transitions from a high voltage to a low voltage, the corresponding input transistor M1 should be switched off (e.g., non-conducting), and the opposite input transistor M2 should be switched on (e.g., conducting) in a short amount of time. However, the reference voltage signal EQIN may be fixed at 0.5×VDD volts as a default. Therefore, the source node voltage of the transistor M2 may take time to settle lower than (0.5×VDD)−Vth volts and the transistor M2 is fully switched on, where Vth is a threshold voltage of the transistors. Since the settling time is generally limited by the input transistor threshold voltages, the input transistor pair M1 and M2 may be implemented using the relatively fast core transistors and the tail current flowing through the transistor pair M3 and M4 may be a relatively large current. As such, the input transistor gate-to-source voltages may increase and so improve the tSU_HL/tSU_LH balance. Furthermore, a size of the core transistors may be smaller than a size of the input/output transistors resulting in less parasitic capacitance and a shorter setup time tSU.

Figure 7:
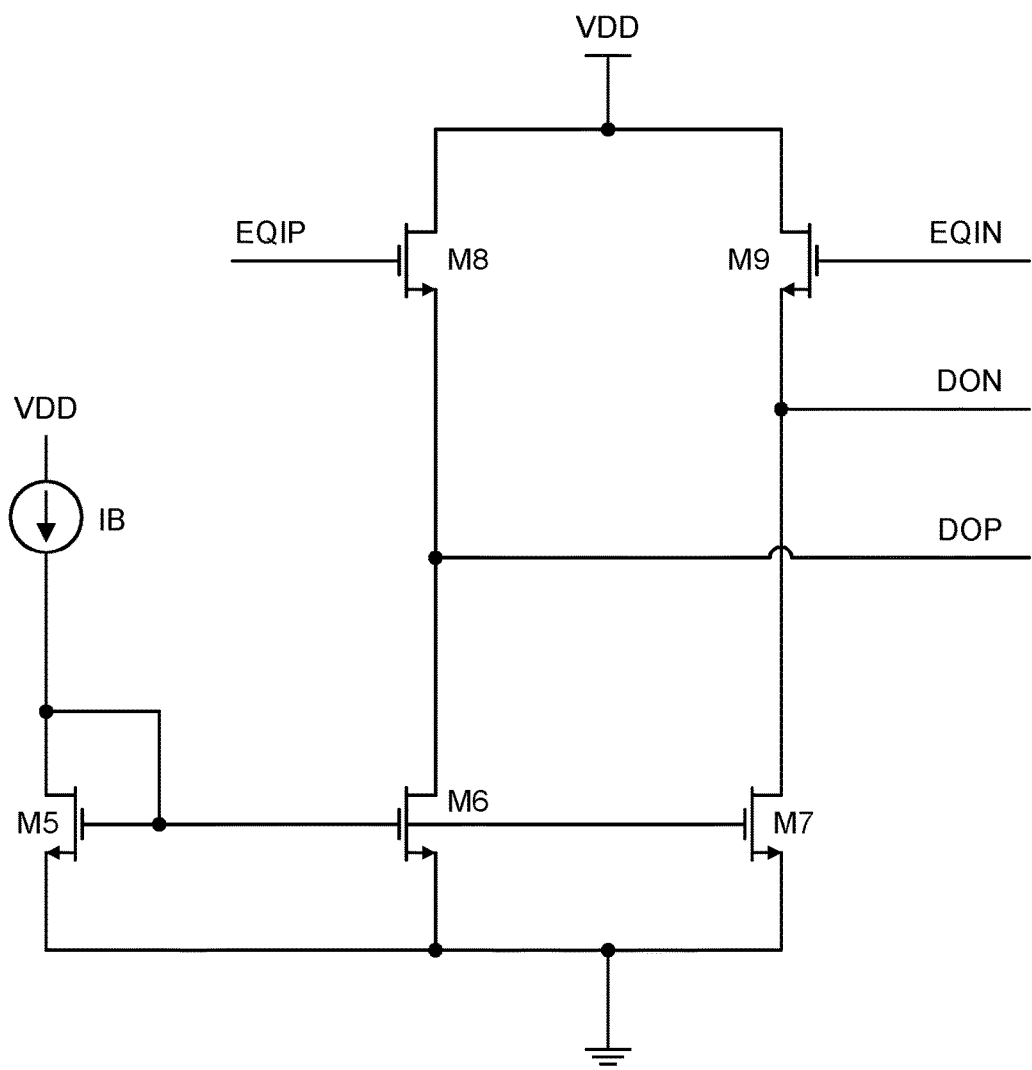
FIG. 7 is a schematic diagram illustrating a delay buffer module in accordance with an example embodiment of the invention.

Referring to FIG. 7, a schematic diagram illustrating an example implementation of the delay buffer module 104 is shown in accordance with an example embodiment of the invention. The delay buffer module 104 generally comprises multiple transistors M5 to M9 and a current source IB. Gate nodes of the transistors M8 and M9 may receive the signals EQIP and EQIN. The signals DOP and DON may be generated at the source nodes of the transistors M8 and M9.

The transistors M8 and M9 are generally arranged as a source follower having parallel paths (or sides). The transistors M6 and M7 may provide constant current loads for the delay buffer module 104. Biasing of the gate nodes of the transistors M6 and M7 may be controlled by the current source IB and the transistor M5. The current generated by the current source IB may not be sensitive to power source fluctuations and so uses the power supply voltage VDD. The source follower generally has a nearly constant dc gain (Avo) per formula 1 as follows:

$$Avo = GmRs/(1+(Gm+Gmb))Rs$$

$$= 1/(1+Gmb/Gm) \qquad (1)$$

Where Rs is an impedance of the input signal source, Gm is a transconductance of the transistors M8 and M9, and Gmb is a back-gate transconductance of the transistors M8 and M9. Since the back-gate transconductance Gmb is commonly small compared with the transconductance Gm (e.g., Gmb=Gm/6), the gain Avo may be less than unity (e.g., 0.86). The output voltages of the source follower in the signals DOP/DON may be a threshold voltage drop (e.g., 250 millivolts to 300 millivolts) below the input voltages in the signals EQIP/EQIN. However, the threshold voltage drop may be within a common-mode voltage range that the slicer modules 106a-106b may accommodate without clipping. In various embodiments, the transistors M8 and M9 may be designed to have a low threshold voltage and thus a low threshold voltage drop.

A dynamic power consumption of the strongARM latch type of delay buffer module 104 may be small (e.g., less than 200 microamperes). The delay buffer module 104 generally has a much wider bandwidth with the same power consumption when compared with the other buffer topologies. A distortion of the delay buffer module 104 may be much lower than an N-bit (e.g., 10 bit) resolution. Furthermore, the delay buffer module 104 generally provides an isolation between the CTLE module 102 and the DFE module 226. The isolation generally results in the DFE module 226 having no impact to the CTLE frequency response.

Figure 8:
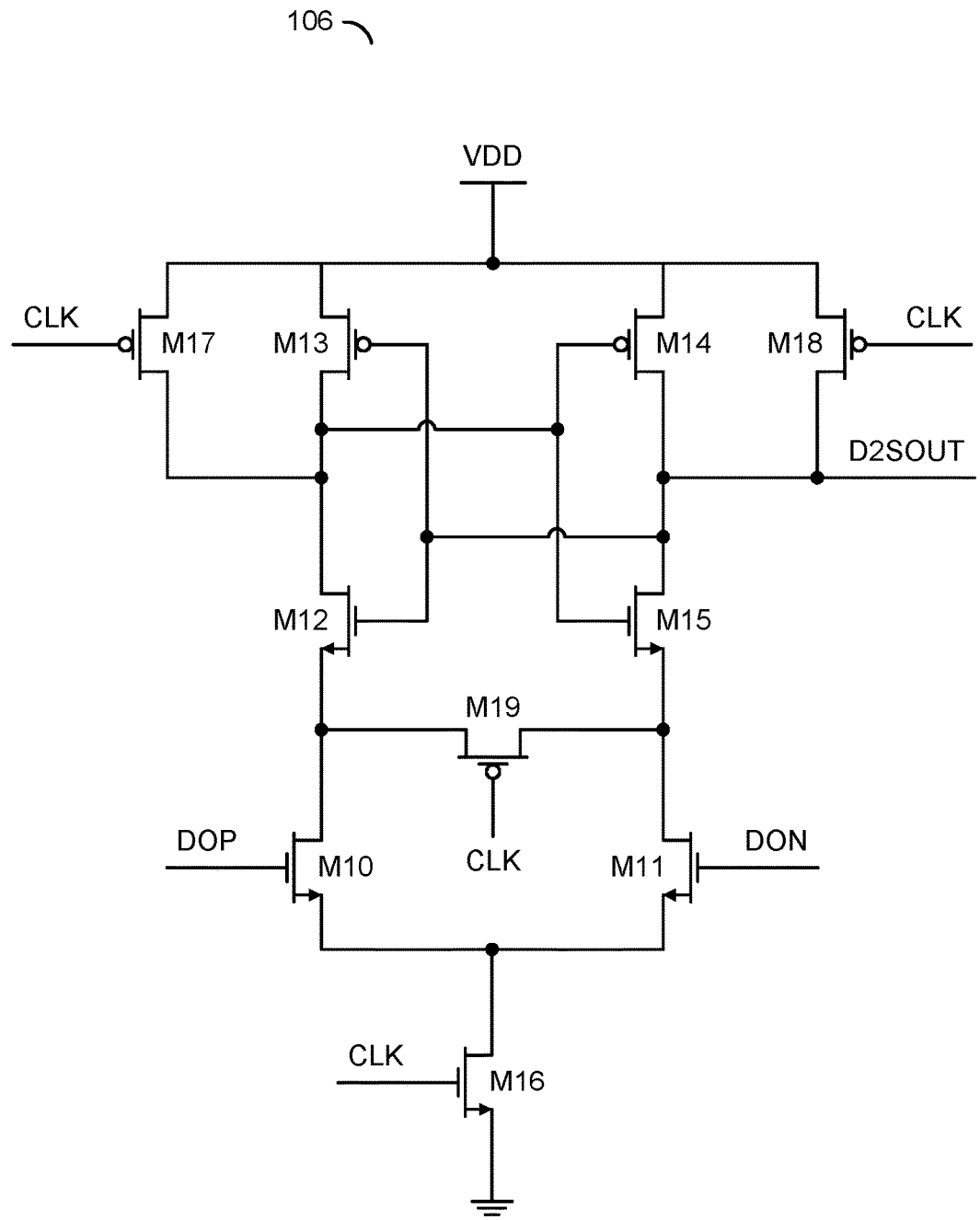
FIG. 8 is a schematic diagram illustrating a slicer module in accordance with an example embodiment of the invention.

Referring to FIG. 8, a schematic diagram illustrating an example implementation of a slicer module 106 is shown in accordance with an example embodiment of the invention. The slicer module 106 may be representative of each slicer module 106a-106b in FIG. 5. The slicer module 106 generally comprises multiple transistors M10 to M19. Gate nodes of the transistors M10 and M11 may receive the signals DOP and DON. Gate nodes of the transistors M16, M17, M18 and M19 may receive the signal CLK. A signal (e.g., D2SOUT) may be generated at the source nodes of the transistors M14 and M18. The signal DS2OUT may implement the signal D2S_EVEN for the slicer module 106a and the signal D2S_ODD for the slicer module 106b.

In various embodiments, the transistors M10 to M19 of the slicer module 106 may be arranged as a strongARM latch. The strongARM latch generally consumes little to no static power, may generate the signal D2SOUT with a rail-to-rail swing and have an input-referred offset that arises from a single differential pair of the signal DOP/DON.

In an example implementation, the slicer module 106 may consume less than 0.5 milliamperes per module. The slicer module 106 may have a signal sensitivity of less than 0.5 millivolts (mV) to 2.0 mV. Furthermore, a clock-to-Q delay (e.g., Tck2Q) may be less than 67 picoseconds. Other designs of the slicer module 106 may be implemented to meet the design criteria of a particular application.

Figure 9:
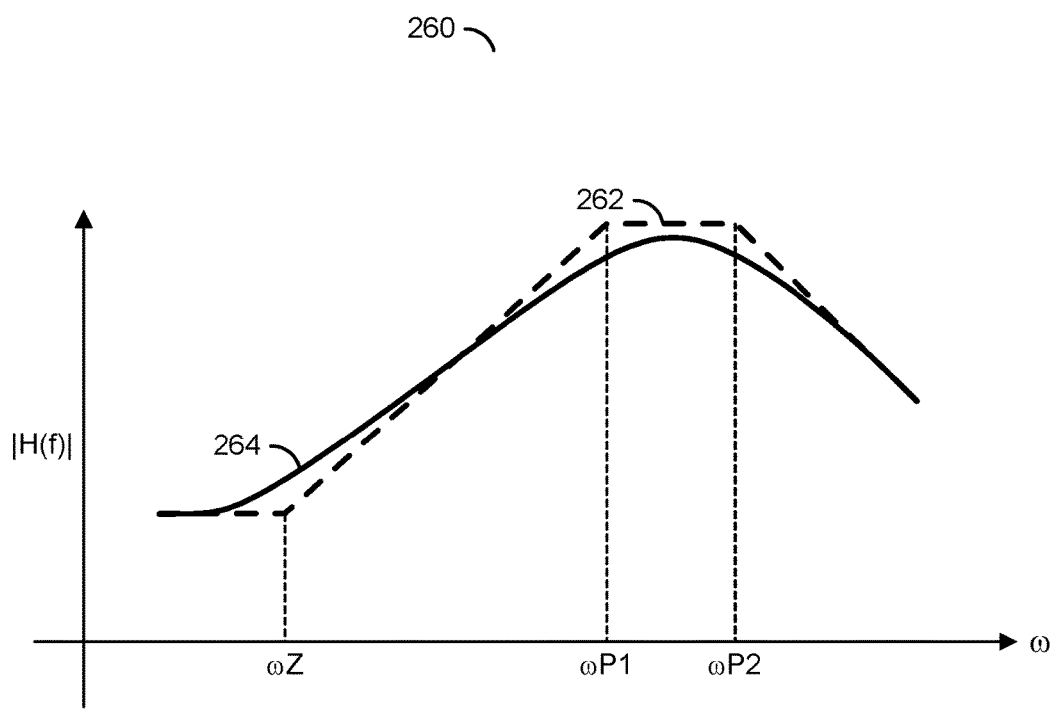
FIG. 9 is a diagram illustrating s frequency response of the continuous-time linear equalizer module in accordance with an example embodiment of the invention.

Referring to FIG. 9, a diagram 260 illustrating an example frequency response of the CTLE module 102 is shown in accordance with an example embodiment of the invention. A curve 262 generally illustrates a Bode approximation of a frequency response |H(f)| of the CTLE module 102. The CTLE module 102 may have a zero at an initial frequency (e.g., ωZ). Two poles (e.g., ωP1 and ωP2) may exist at two higher frequencies. A curve 264 may illustrate an actual frequency response |H(f)| of an example design of the CTLE module 102.

Figure 10:
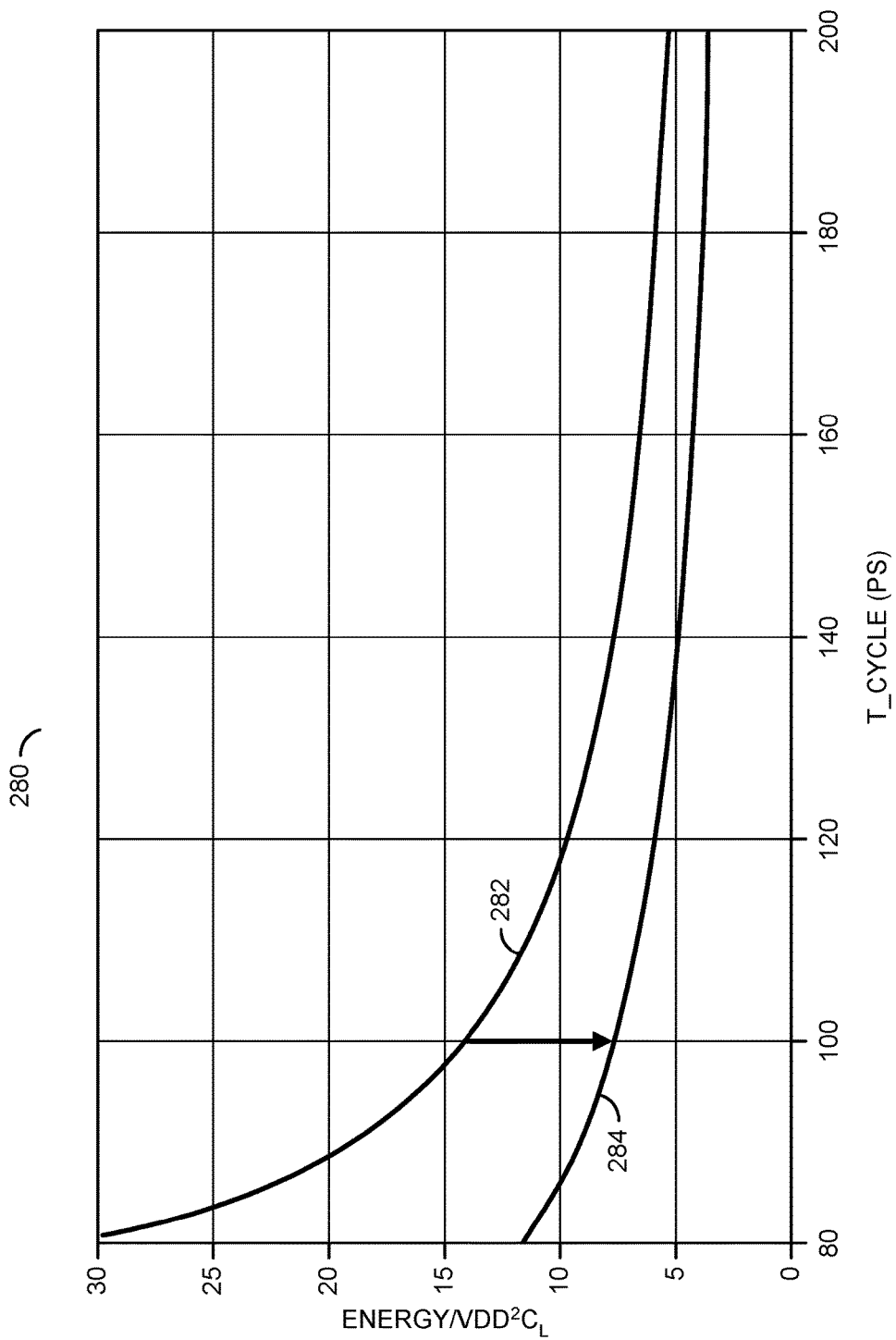
FIG. 10 is a diagram illustrating an energy response of a delay buffer module in accordance with an example embodiment of the invention.

Referring to FIG. 10, a diagram 280 illustrating an example energy response of the delay buffer module 104 is shown in accordance with an example embodiment of the invention. A curve 282 may illustrate a normalized energy (e.g., energy/$Vdd^2 C_{load}$) as a function of cycle time (e.g., Tcycle (picosecond)) from a common CML latch optimized for power. A curve 284 may illustrate the normalized energy as a function of cycle time for a strongARM latch type of slicer module 106. At a 100 ps cycle time, the strongARM latch is approximately twice as power efficient as the common CML latch.

Figure 11:
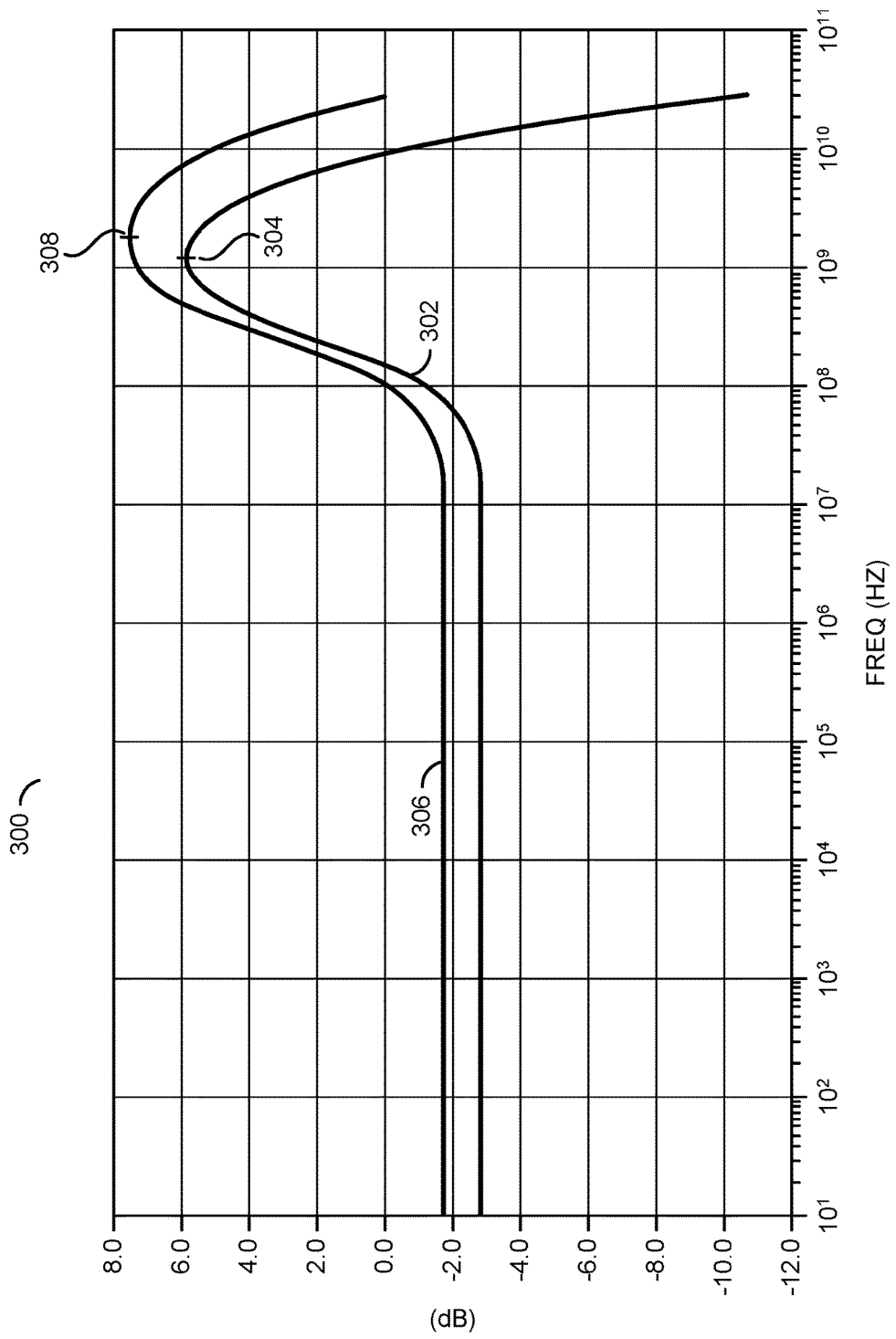
FIG. 11 is a diagram illustrating a gain of the continuous-time linear equalizer module in accordance with an example embodiment of the invention.

Referring to FIG. 11, a diagram 300 illustrating an example gain of the CTLE module 102 is shown in accordance with an example embodiment of the invention. A curve 302 may illustrate an adjustable gain (e.g., in dB) of the CTLE module 102, with the source follower module 104 integrated as part of the CTLE module 102, as a function of frequency (e.g., in hertz (Hz)). A low frequency gain of the curve 302 may be approximately −2.8 dB in the example. A peaking gain (e.g., 6 dB), as measured at an output of the source follower module 104, may occur at a point 304 centered around approximately 1.6 GHz. A curve 306 may illustrate a DC gain of the CTLE module 102. The DC gain may be approximately −1.9 dB in the example. A peaking gain of the curve 306 as measured at the CTLE module 102 may occur at a point 308 centered around approximately 2 GHz.

Figure 12:
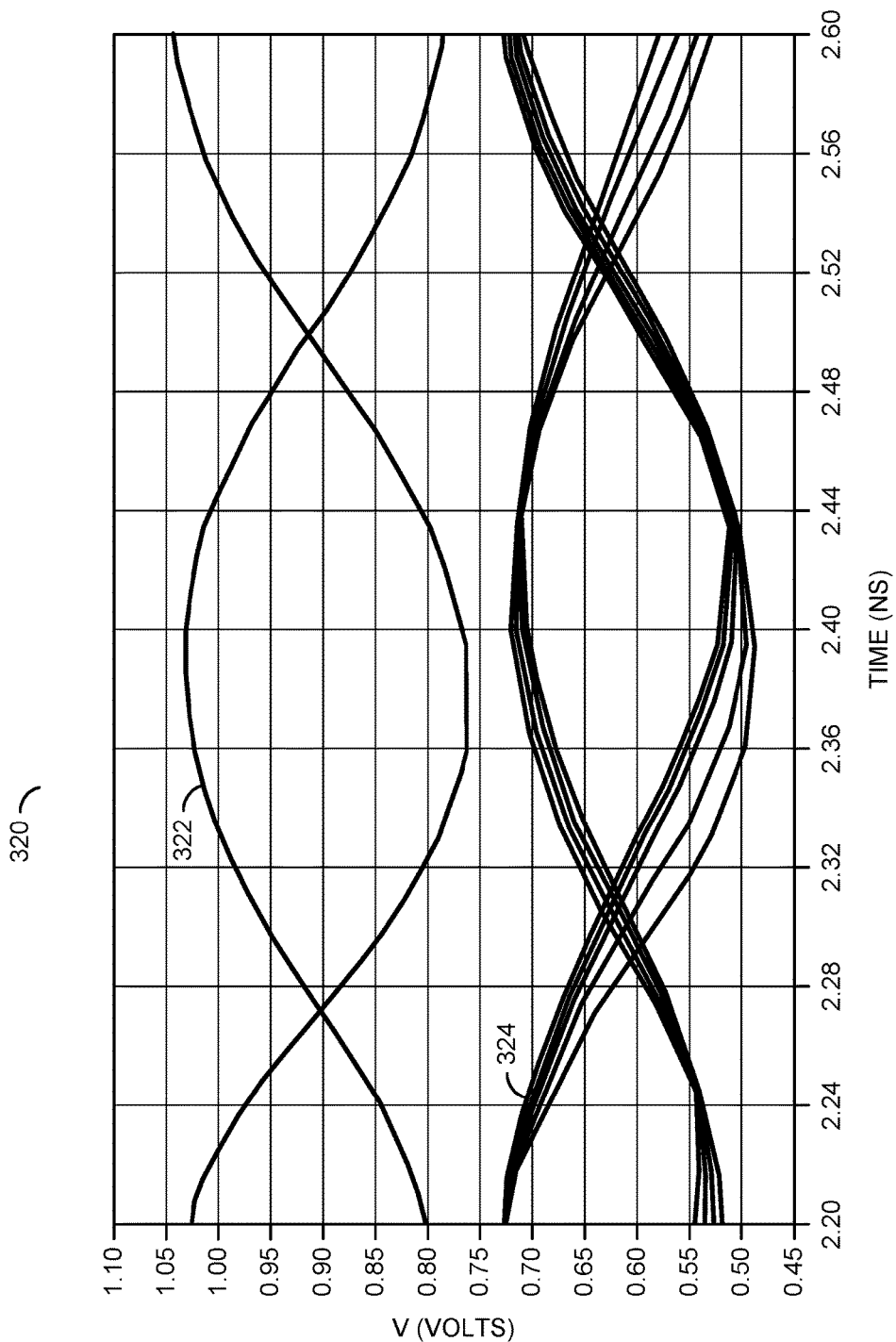
FIG. 12 is a diagram illustrating an eye response of an apparatus in accordance with an example embodiment of the invention.

Referring to FIG. 12, a diagram 320 illustrating an eye response of the apparatus 100 is shown in accordance with an example embodiment of the invention. A curve 322 generally illustrates an output voltage (e.g., in volts) of the CTLE module 102 as a function of time (e.g., in nanoseconds (ns)). A curve 324 may illustrate an output voltage of the delay buffer module 104 over a variety of programmable delays. As illustrated, the curve 324 shows that the eye may be delayed by a programmable amount of approximately 3 ps to approximately 50 ps.

While FIGS. 3 and 4 show the apparatus 100 in the context of the data buffers 70a-70n while receiving information, copies of the apparatus 100 may be implemented at other locations, other data paths and/or other control paths. In some embodiments, copies of the apparatus 100 may be located in the RCD 74 to improve the signals received from the memory controller 20. In various embodiments, copies of the apparatus 100 may be located at the other end of the data bus 30 to improve various signals generated by the memory modules 50a-50n and received by the memory controller 20. For example, the memory controller 20 may include copies of the apparatus 100 to equalize the read data sent in the signals DQa-DQn from the memory modules 50a-50n during a read cycle. Instances of the apparatus 100 may also be implemented in other circuitry within the memory modules 50a-50n.

Although embodiments of the invention have been described in the context of a DDR4/DDR5 application, the present invention is not limited to DDR4/DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 12 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a continuous-time linear equalizer circuit configured to generate a first intermediate signal by equalizing an input signal relative to a reference voltage, wherein (i) said input signal is single-ended and (ii) said first intermediate signal is differential;
   a buffer configured to generate a second intermediate signal by delaying said first intermediate signal, wherein said second intermediate signal is differential; and
   at least one slicer configured to generate an output signal by slicing said second intermediate signal, wherein said output signal is single-ended.

2. The apparatus according to claim 1, wherein said buffer consumes less than 200 microamperes.

3. The apparatus according to claim 1, wherein said slicer has a signal sensitivity of less than 4 millivolts.

4. The apparatus according to claim 1, wherein said apparatus comprises a double data rate memory module.

5. The apparatus according to claim 4, wherein said double data rate memory module comprises a double data rate fourth generation dual in-line memory module.

6. The apparatus according to claim 1, further comprising a capacitance circuit coupled to said buffer and configured to adjust a delay of said second intermediate signal.

7. The apparatus according to claim 6, wherein a capacitive loading created by said capacitance circuit is programmable.

8. The apparatus according to claim 1, wherein said buffer comprises a source follower having a gain of less than unity.

9. The apparatus according to claim 1, wherein said slicer comprises a strongARM circuit.

10. The apparatus according to claim 1, wherein said continuous-time linear equalizer circuit comprises a current mode logic continuous-time linear equalizer circuit.

11. The apparatus according to claim 1, wherein said apparatus is configured to delay a data path to align with a synchronization signal.

12. The apparatus according to claim 1, wherein said apparatus implements a data buffer circuit.

13. The apparatus according to claim 1, wherein said input signal is between 1.2 gigahertz and 3.2 gigahertz.

14. A method for delay between an equalizer and at least one slicer, comprising the steps of:
   generating a first intermediate signal by equalizing an input signal relative to a reference voltage with a continuous-time linear equalizer, wherein (i) said input signal is single-ended and (ii) said first intermediate signal is differential;
   generating a second intermediate signal by delaying said first intermediate signal with a buffer, wherein said second intermediate signal is differential; and
   generating an output signal by slicing said second intermediate signal with said slicer, wherein said output signal is single-ended.

15. The method according to claim 14, wherein (i) said buffer consumes less than 200 microamperes and (ii) said slicer has a signal sensitivity of less than 4 millivolts.

16. The method according to claim 14, further comprising the step of:
   adjusting a delay of said second intermediate signal.

17. The method according to claim 14, wherein said method is implemented in a double data rate memory module.

18. The method according to claim 17, wherein said double data rate memory module comprises a double data rate fourth generation dual in-line memory module.

* * * * *